(12) United States Patent
Harkin

(10) Patent No.: US 6,327,376 B1
(45) Date of Patent: *Dec. 4, 2001

(54) ELECTRONIC APPARATUS COMPRISING FINGERPRINT SENSING DEVICES

(75) Inventor: Gerard F. Harkin, Brighton (GB)

(73) Assignee: U.S. Philips Corporation, New York, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/204,181

(22) Filed: Dec. 3, 1998

(30) Foreign Application Priority Data

Dec. 4, 1997 (GB) ................................. 9725571

(51) Int. Cl.⁷ .................................................. G06K 9/00
(52) U.S. Cl. ................................................ 382/124; 356/71
(58) Field of Search .................................. 382/115, 124, 382/125; 235/380, 492; 704/246, 273; 902/3, 4, 25; 340/825.3, 825.34; 283/68; 356/71; 705/1, 26, 42; 345/104, 174; 178/18.01, 18.06

(56) References Cited

U.S. PATENT DOCUMENTS

| | | | |
|---|---|---|---|
| 4,759,369 | | 7/1988 | Taylor .................................. 600/323 |
| 5,088,817 | * | 2/1992 | Igaki et al. .............................. 356/71 |
| 5,270,711 | * | 12/1993 | Knapp .................................... 341/34 |
| 5,280,527 | * | 1/1994 | Gullman et al. ...................... 713/184 |
| 5,325,442 | | 6/1994 | Knapp .................................. 382/124 |
| 5,349,174 | * | 9/1994 | Van Berkel et al. ............. 250/208.1 |
| 5,420,936 | * | 5/1995 | Fitzpatrick et al. .................. 382/124 |
| 5,635,723 | * | 6/1997 | Fujieda et al. ........................ 250/556 |
| 5,719,950 | * | 2/1998 | Osten et al. .......................... 382/115 |
| 5,736,734 | * | 4/1998 | Marcus et al. ....................... 250/225 |
| 5,796,858 | * | 8/1998 | Zhon et al. ........................... 382/127 |
| 5,862,248 | * | 1/1999 | Salatino et al. ..................... 382/124 |
| 5,926,261 | * | 7/1999 | Hoshino ................................. 356/71 |
| 6,088,585 | * | 7/2000 | Schmitt et al. ....................... 455/411 |

FOREIGN PATENT DOCUMENTS

| | | | |
|---|---|---|---|
| 0790479 | 8/1997 | (EP) | ................................. G01B/7/00 |
| WO9726013 | 9/1995 | (WO) | ............................. G07C/9/00 |
| WO9740744 | 11/1997 | (WO) | ............................. A61B/5/117 |
| 9849691 | 11/1998 | (WO) . | |

* cited by examiner

*Primary Examiner*—Samir Ahmed
(74) *Attorney, Agent, or Firm*—Steven R. Biren

(57) ABSTRACT

An electronic apparatus comprising a fingerprint sensing device (10) having an array of sensing elements (12) carried on a transparent substrate (35) for sensing capacitively the ridge pattern of a fingerprint placed over the array, in which the transparency of the device is utilised to provide additional capabilities. Thus, an optical sensing device (60) may be disposed beneath the device (10) to sense optically through the device a further biometric characteristic, or the presence, of the finger overlying the sensing element array. Substantial transparency can be afforded to the device by forming the sense electrodes (30) of the array from transparent conductive material. In products like mobile telephones, notebook computers, PDAs, smart cards or like portable electronic products of small size such as fingerprint sensing device can then advantageously be arranged overlying a display device with the display output being visible through the device.

14 Claims, 4 Drawing Sheets

ELECTRONIC APPARATUS COMPRISING FINGERPRINT SENSING DEVICES

FIELD OF THE INVENTION

The present invention relates to electronic apparatus comprising fingerprint sensing devices.

BACKGROUND OF THE INVENTION

There is presently considerable interest in the use of fingerprint sensing for user identification or verification purposes. For this, a person's fingerprint is acquired by means of a fingerprint sensing device whose output is processed and compared with stored characteristical data of one or more fingerprints to determine whether a match exists. The most common form of fingerprint sensing device employs an optical imaging technique in which light from a light source is directed into one face of a glass prism, reflected from a second face and passes out from the third face where it is detected by a form of an electronic camera such as a CCD with associated optical elements. A finger is placed on the second face and where ridges of the fingerprint contact the glass face reflection no longer takes place. Through this effect an optical image of the fingerprint can be detected by the camera.

More recently, other forms of fingerprint sensing devices have been proposed which rely on different techniques for sensing fingerprint patterns, using for example alternative approaches such thermal sensing, pressure sensing, capacitive sensing, and skin resistance sensing. In these, an array of sensing elements define a sensing area over which a person's finger tip is directly placed and the need for an optical system is eliminated, which can result in a much more compact device.

There is currently much interest in incorporating fingerprint sensing devices in a wide range of products for security reasons. For example, the growth of the internet and the need for security when conducting internet commerce transactions has led to proposals for fingerprint sensing devices to be built into desk top and portable computer systems. Security of banking transactions using automatic teller machines can also be improved using fingerprint sensing. Similarly it has been proposed to use fingerprint sensing devices in other portable electronic equipment such as mobile phones and smart cards as a means of preventing unauthorised usage.

For many of these applications there is a need for a fingerprint sensing device which is both compact, particularly where portable electronic equipment is involved, and relatively inexpensive. The conventional optical image sensing device, requiring a light source, prism and image sensor, is both bulky and expensive, and therefore wholly unsuited to such uses. Of the other kinds of sensing devices, those using the capacitive sensing approach are considered to offer the most promise in view of their potential performance, low overall size, ease of manufacture and low cost. Typically, such fingerprint sensing device comprises an array of individual sensing elements, each including a sense electrode, over which a finger is placed and operate by sensing a measurable capacitive effect produced by the sense electrode in combination with an overlying ridge of the user's fingerprint.

Examples of capacitive fingerprint sensing devices are described in U.S. Pat. No. 5,325,442 (PHB 33628), PCT WO 97/40744 (PHB 34068) and PCT IB 98/00407 (PHB 34153). In these, each sensing element in the array consists of a metal sense electrode connected via one or more switching devices to sets of address conductors and the sensing elements are operated using an active matrix addressing scheme to provide a measure of the individual capacitances formed between each sense electrode and respective overlying ridge or valley of a person's fingerprint placed on a sensing surface provided by a layer of dielectric material overlying the sense electrodes and on whose surface the finger is placed. The device can be in the form of a semiconductor integrated circuit, using a silicon wafer, or a thin film device in which the sense elements and address conductors comprise thin film circuit elements carried on an insulating substrate such as glass and formed by depositing and patterning thin film insulator and metal layers and amorphous or polycrystalline semiconductor compounds for the switching devices, e.g. diodes or thin film transistors. Another example of a capacitive type fingerprint sensing array produced in the form of an integrated chip is described in EP-A-0790479. In this device each sensing element consists of two laterally—spaced sense electrodes connected to an amplifier circuit.

Although these devices are capable of satisfying some of the demands, particularly as regards compactness and manufacturing cost, there is a need for improvement. One problem which could be experienced in use is that of attempted fraudulent operation. It is conceivable, for example that a plastic replica of a person's finger, having surface topography, could be used to "fool" the device. Accordingly, it would be advantageous to be able to ensure that the finger whose print is being read is a "live" finger. It would be desirable also to improve the capabilities of the sensing device further with regard for example to their ease of deployment, and suitability for use, in small portable products such as mobile phones, personal digital assistants and the like, and their ability to function in combination with other components.

SUMMARY OF THE INVENTION

It is an object of the present invention, therefore, to provide an improved form of fingerprint sensing device, or an electronic apparatus comprising a fingerprint sensing device, which is capable of satisfying at least to some extent some of these desires.

According to one aspect of the present invention there is provided an electronic apparatus comprising a fingerprint sensing device having an array of closely spaced sensing elements carried on a transparent substrate for sensing capacitively ridges of a person's fingerprint when placed over the array, each sensing element having a sense electrode for producing in combination with an overlying fingerprint part a capacitive effect, which is characterised in that the sensing elements of the array are substantially transparent with the sense electrodes being formed of transparent conductive material.

By virtue of making the sense electrodes substantially transparent, and the fact that the substrate on which the electrodes are carried is itself transparent, the sensing device itself becomes substantially transparent. In capacitive type sensing devices, a major proportion of the area of each sensing element is occupied by the sense electrode and the sense electrodes are closely packed. Thus, by using transparent sense electrodes, substantial transparency is provided to the sensing device. The invention stems in part from the realisation that such transparency can be of considerable benefit to achieving additional functionality and also an appreciation that certain known kinds of capacitive fingerprint sensing devices are readily capable of modification in a simple and convenient manner for this purpose, as a result of which the capabilities of such sensing devices are significantly increased and rendering them able to satisfy a number of desires. In particular, it becomes possible to provide known kinds of optical, contactless, type biometric sensors beneath the sensing element array, i.e. on its side remote from that over which the finger is placed, for the purpose of sensing through the array additional finger biometric characteristics such as temperature, pulse rate, blood oxygen content and the like at the same time as a fingerprint is being taken for further authenticating the presence of a "live" finger, thereby reducing the risk of fraudulent use, and without requiring for example any enlargement of the device's sensing area.

A biometric authentication system is described in PCT WO 95/26013 which comprises a fingerprint sensor of conventional optical type employing a camera, together with a pulse oximeter sensor of the kind which uses LED's emitting visible and IR light and a photodetector. The latter components are arranged so as to lie on either side of the finger when placed in position over the fingerprint sensor and therefore occupy further space outwardly of the fingerprint sensor and necessitating a specially—shaped housing for their accommodation and defining a recess into which the finger has to be placed. On the other hand, with a sensing device according to the invention, optical sensors, for example comprising LEDs and a photodetector, can be positioned behind the substrate of the device and, utilising the transparency of the device, additional biometric characteristics, such as pulse, blood oxygen levels, finger temperature or skin colouring, sensed optically through the array using a reflective technique, thereby keeping the sensing region compact. Moreover, specially—shaped housings need not be used and the outer surface of the sensing device and the surrounding parts of its housing may be generally flat. Alternatively, an optical sensing device may be used behind the sensing element array which is of a type suitable merely for sensing the presence of a finger. For example, the device may comprise a light emitter, e.g. an LED for emitting a beam of light through the fingerprint sensing device, and a light detector for detecting light reflected back through the fingerprint sensing device, as would happen if a finger were present over the array. Such a sensing device may be connected to the drive control circuit of the fingerprint sensing device and arranged to initiate scanning operation of the device automatically upon a finger being placed over the array and detected by the optical sensing device. It will be appreciated that the term light as used herein is intended to include parts of the spectrum other than visible light, such as infra-red.

In some situations it may not be necessary to make the sense electrodes transparent to achieve substantial transparency of the fingerprint sensing device and the device may be adequately transparent for certain purposes when using opaque sense electrodes by virtue of the existing transparency of the areas surrounding the sense electrodes and the associated addressing circuitry. The extent of these transparent areas could be optimised if desired by minimising the proportion of the area of the sensing element occupied by the sense electrode. According to another aspect of the present invention, therefore, there is provided an electronic apparatus comprising a fingerprint sensing device having an array of spaced sensing elements carried on a transparent substrate for sensing capacitively the ridge pattern of a person's fingerprint where placed over the array, characterised in that the apparatus includes an optical sensing device disposed at the side of the substrate opposite to the sensing element array which optical sensing device is responsive to light passing through the sensing element array and the substrate.

The optical sensing device may again be a biometric sensor for optically sensing through the fingerprint sensing device a further biometric characteristic of a user's finger, or an optical sensing device for example for sensing the presence of a finger over the array.

The increased transparency of the fingerprint sensing device resulting from the use of transparent sense electrodes may be beneficially employed for other purposes. In particular, the sensing device can be disposed over a display device, or a part thereof, whilst still allowing the display output to be viewed. This capability offers considerable advantages in, for example, the field of portable electronic products using displays, such as mobile phones, certain smart cards, PDAs, and other portable computers. Earlier proposals for incorporating fingerprint sensing devices in such products involve arranging the fingerprint sensing device in a region of the product casing away from the display device, thereby either necessitating a larger casing or sacrificing an area of the casing which could otherwise have been used for other purposes. When used in this manner, the display device may be operated to assist in the utilisation of the fingerprint sensing device, for example by indicating through its display elements the area overlaid by the sensing element array, and thus the position on the display over which the finger should be placed, and by presenting operating instructions to a user. In the case of some smart cards or other credit card like products which may not have an integral display device as such, the fingerprint sensing device may simply be arranged to overlie a region carrying printed information which information would still be visible through the device. This can be advantageous bearing in mind that the amount of space available in this kind of product is severely limited.

The fingerprint sensing device is preferably of the kind which is fabricated using thin film technology involving the deposition and patterning of thin film layers on a transparent, insulating, substrate, such as glass, for example as described in the aforementioned U.S. Pat. No. 5,325,442, PCT WO 97/40744 and PCT IB 98/00407. In the devices described in these specifications the sensing elements each include one or more switching devices, in the form of TFTs or diodes, and are addressed via a set of row, scanning, address conductors and a set of column, read-out, address conductors. The sensing elements are spaced closely together at a pitch appropriate to providing a resolution suitable for fingerprint reading, with a major proportion of the area of each element being devoted to the sense electrode. By using transparent conductive material such as ITO for the sense electrodes rather than a metal such as chromium as described in these specifications a high degree of transparency is then afforded. The overall effective transparency of the array can be further improved by forming at least one of the sets of address conductors also from transparent conductive material or by arranging the switching devices so as to overlap substantially with an address conductor, i.e. extending above or below an address conductor, so as in effect to reduce the amount of area within the overall area of each sensing element which needs to be dedicated to the provision of the switching devices and increase the effective aperture ratio of the sense element.

For the purpose of sensing fingerprints, a row and column array of sensing elements typically occupies an area of around 2.5 to 3 cm square and comprises around 500 rows with 500 sensing elements in each row. The size of the array is thus similar to the size of displays typically used in mobile telephones and the like so that the sensing device may conveniently be disposed over the display to occupy the same area. However, in certain products where the display used is not generally square shape but rectangular with reduced height, it is envisaged that the sensing device may instead comprise just one or a few rows of sensing elements providing a ID, or linear type of sensor which relies on a swiping action of a person's finger tip and which is operable to provide a series of readings as the finger tip is moved transversely of the array, each of which represents a respective strip of the fingerprint. These readings are then processed to build up an electronic image of the complete fingerprint.

BRIEF DESCRIPTION OF THE DRAWINGS

Embodiments of electronic apparatus in accordance with the present invention will now be described, by way of example, with reference to the accompanying drawings, in which.

It is to be understood that the Figures are merely schematic and are not drawn to scale. Certain dimensions may have been exaggerated while others have been reduced. The same reference numbers are used throughout the Figures to indicate the same, or similar, parts.

DETAILED DESCRIPTION OF THE PREFERRED EMBODIMENT

Figure 1:
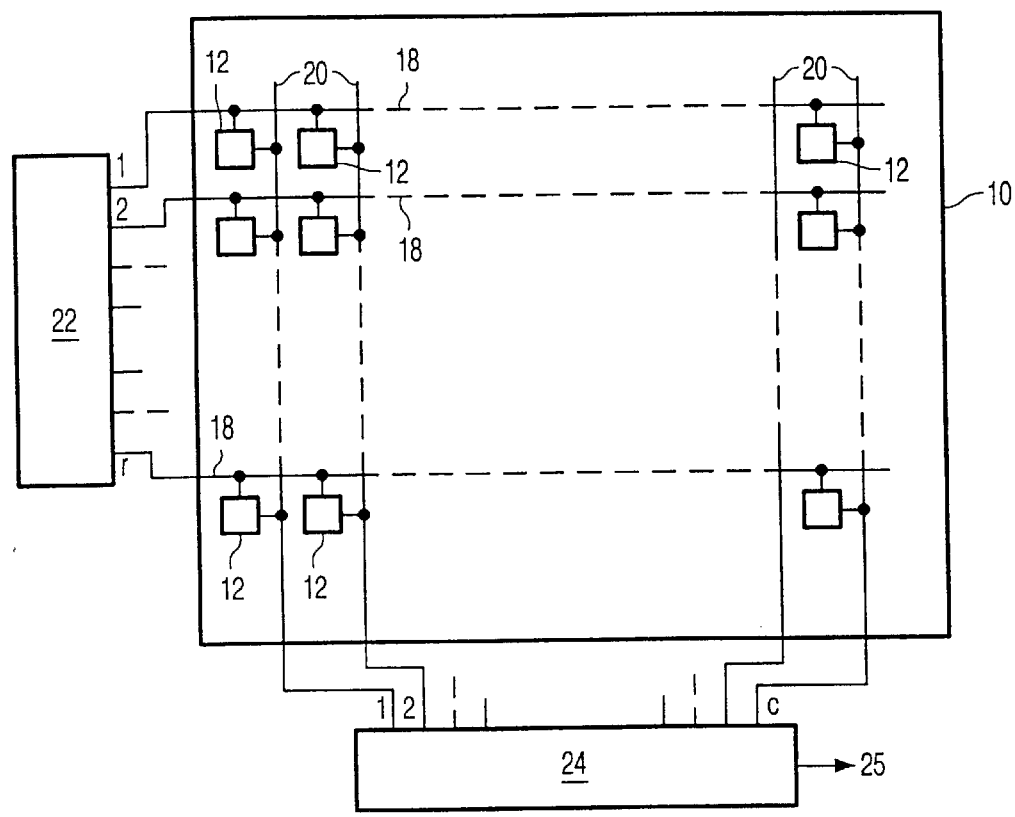
FIG. 1 is a simplified schematic diagram of part of an embodiment of electronic apparatus according to the invention comprising a capacitive type of fingerprint sensing device.

The electronic apparatus comprises a fingerprint sensing device of the capacitive sensing kind in which the positions of the ridges of a person's fingerprint are determined using a capacitance effect resulting from the proximity of the ridges of a fingerprint to individual sensing elements of the device. The fingerprint sensing device used in this embodiment is, apart from certain differences which will be described subsequently, generally similar to known devices described for example in U.S. Pat. No. 5,325,442, WO 97/40744 and British Patent Application No. 9708559.1, whose disclosures are incorporated herein by reference, that are fabricated using thin film technology as used in other large area electronic devices such as active matrix LC display devices involving the deposition and patterning of thin film layers on an insulating, glass, substrate. Reference is invited to these specifications for more details of the instruction and operation of the devices. Briefly, however, and referring to FIG. 1, the fingerprint sensing device comprises an active matrix addressed sensing pad 10 having an X–Y array of regularly spaced sense elements 12, consisting of r rows (1 to r) each with c sense elements, which are operable to scan a fingerprint. Only a few rows and columns are shown for simplicity. In practice there may be around 512 rows and 512 columns of sense elements occupying an area of approximately 2.5 cms by 2.5 cms. The array of sense elements 12 is addressed by addressing means comprising a row drive circuit 22 and a sense circuit 24 via sets of regularly-spaced row (selection) address conductors 18 and column (sensing) address conductors 20 connected at their ends the circuits 22 and 24 respectively with individual sense elements being located at respective intersections of the two sets of conductors. All sense elements in the same row are connected to a respective one of row conductors 18 and all sense elements in the same column are connected to a respective, common, column conductor 20. An output 25, comprising an electronic representation of a scanned fingerprint, is obtained from the circuit 24.

Figure 3:
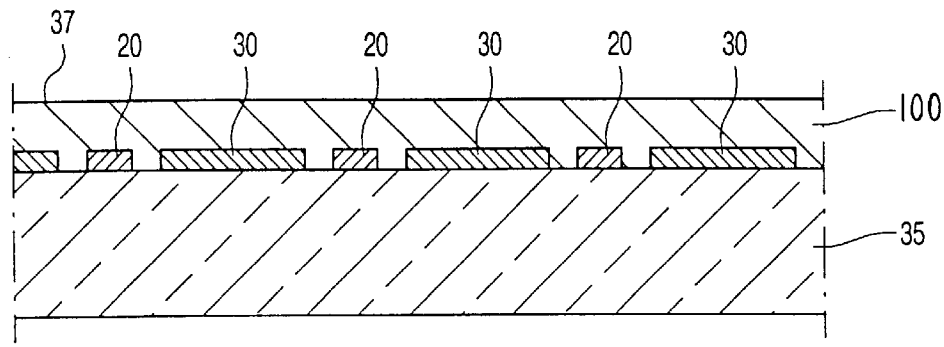
FIG. 3 is a schematic cross-sectional view through a typical part of the sensing element array of the device of FIG. 1.

An example of one form of array construction is shown schematically and simplified in FIG. 3 which is a cross-section through a representative part of the pad 10 comprising three complete sense electrodes 30 carried on the insulating substrate 35. The switching devices are not visible in this section. The array of sense electrodes 30, comprising regularly spaced, and equally sized, rectangular conductive pads, and the address conductors 20 extending therebetween are defined from a common deposited layer. Insulating material is provided, for example, between the conductors 18 and 20 at the regions where they cross-over. The set of row conductors 18, not visible in FIG. 3, is formed from a common deposited layer with each row conductor extending between adjacent rows of sense electrodes 33. Integral extensions of the sense electrode 30 and the row and column conductors are used to provide contact terminals for the associated switching devices. To complete the structure a dielectric film 100, for example of silicon nitride or polyimide, is deposited completely over the structure on the substrate 35 to provide a continuous sensing surface 37 spaced a predetermined distance from, and substantially parallel to, the substrate surface.

The physical dimensions and mutual spacings of the sense electrodes 30, and consequently the sense elements, are chosen in accordance with the resolution characteristics required for fingerprint sensing. By way of example, the sense electrodes may have a pitch of around 50 to 100 micrometres in both the row and column directions. The thickness of the dielectric film 36 is selected taking into account the value of the relative permittivity of the insulating material and the area of the sense electrode. For example, a relative permittivity of approximately 6, and a film thickness around 0.1 micrometres may be used with a sense electrode around 50×50 micrometres.

In operation of this sensing device, a finger whose print is to be scanned is placed on the sensing surface 37. Actual, or close, physical contact with the surface 37 then occurs at the ridges of the fingerprint. Troughs in the fingerprint profile are spaced from the surface 37 by a considerably greater distance. The ridged finger surface is therefore spaced from the array of electrodes 30 by a minimum distance determined by the thickness of the thin dielectric film 36 and each sense electrode 30 and the respective overlying portion of the finger surface form a capacitance, the finger surface portion being effectively at an ac ground potential. The capacitances vary as a function of the spacing between the finger surface and the sensing surface 37 and the variation in capacitances produced over the array of sense elements 12 of the pad 10 by a fingerprint ridge pattern thus constitutes in effect an electronic "image" of the three dimensional form of the fingerprint surface. These capacitances are sensed and an output provided by the circuit 24 indicative of the variation, and hence the three-dimensional profile of the fingerprint.

The fingerprint sensing element array of the device in this embodiment is substantially transparent. This is achieved utilising beneficially the fact that the substrate is of a transparent material, preferably glass, and simply by forming the sense electrodes 30 of the sense elements 12, and preferably the sets of row and column conductors 18 and 20 as well, from an optically transparent conductive material such as ITO. Any necessary insulating layers, for example between the row and column conductors at their crossovers is formed of transparent insulating material such as silicon oxide or nitride. The dielectric covering layer 36, of silicon nitride or polyimide, is similarly transparent.

Figures 2A, 2B:
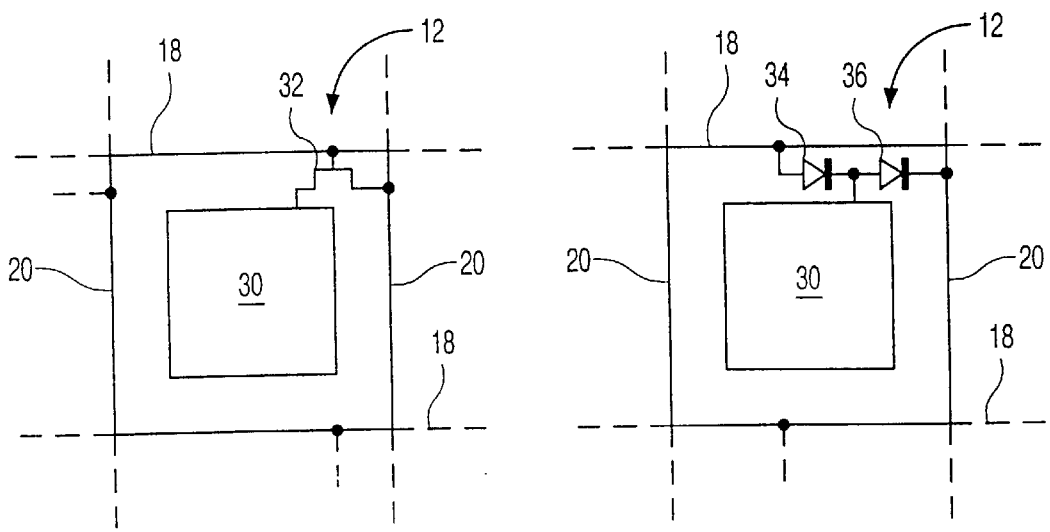
FIGS. 2A and 2B illustrated schematically the equivalent circuits of two example forms of sensing elements in a sensing element array of the device of FIG. 1.
Figure 4:
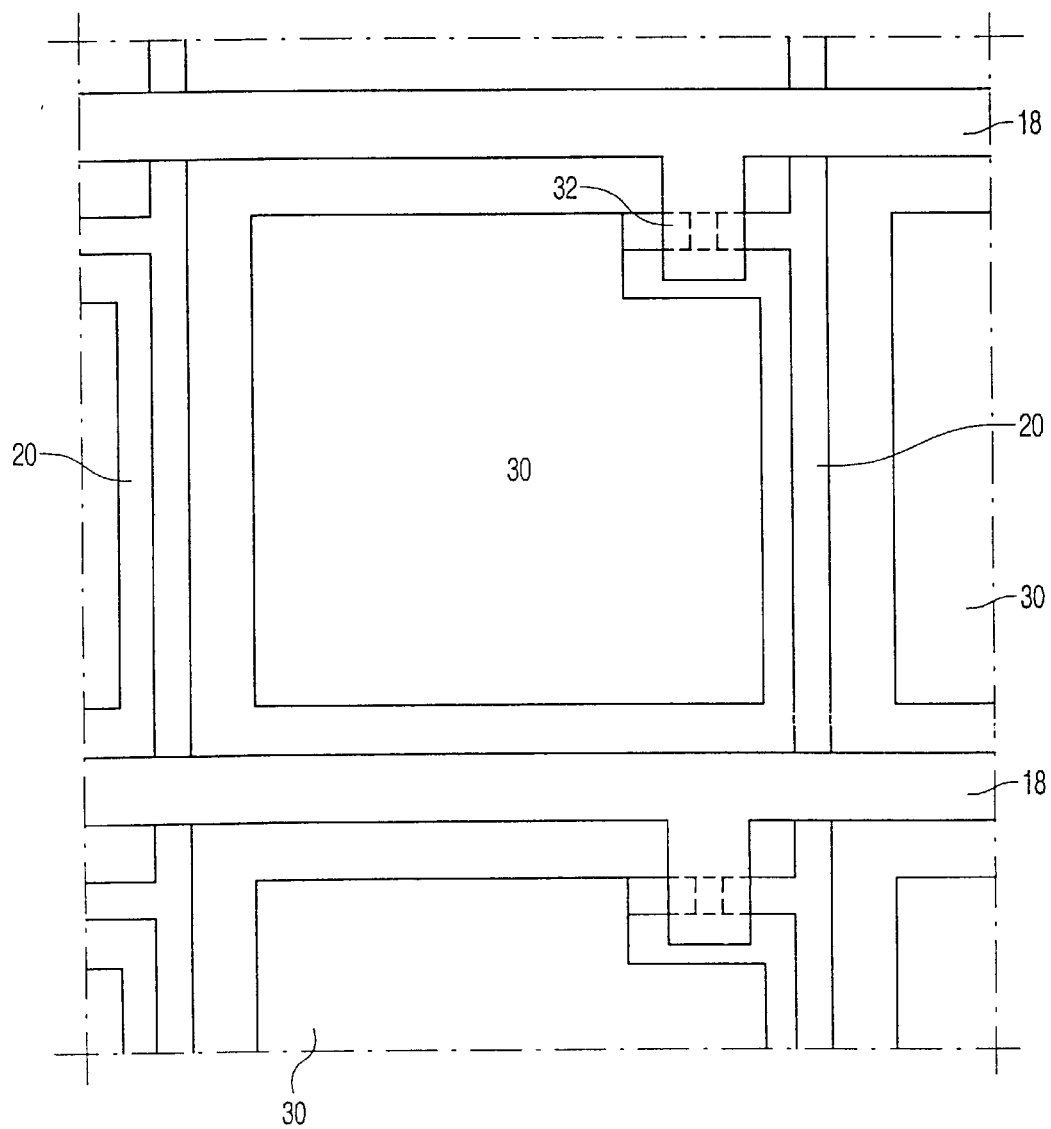
FIG. 4 is a schematic plan view of part of the sensing element array showing its component lay-out.

FIG. 4 shows schematically in plan view of a sense element 12 of the kind shown in FIG. 2A to illustrate a typical component lay-out. As can be seen, the sense electrode 30, which is generally rectangular, occupies a major proportion of the area of the sense element. It will be appreciated that the regions between the sides of the sense electrode 30 and the respective adjacent portions of the row and column conductors are transparent and as the sense electrode 30 and row and column conductors 18 and 20 are formed from transparent conductive material the sensing element array will be substantially transparent. The only region of a sense element where transparency may be reduced is at the switch device. However, as the actual area occupied by the TFT, as shown in FIG. 4, or similarly by the diodes if used instead, is very small compared with the overall area of the sense element, typically around 5 to 10% of the overall sensing element area, the effect on general, overall, transparency of the array will be negligible.

Depending on the degree of transparency required, which could vary according to the particular manner in which the transparency of the sensor is to be utilised, it may not be necessary to form with sets of address conductors 18 and 20 from transparent conductive material. Instead one or both sets could be of metal. In so doing, the overall transparency would not be unduly affected as the area occupied by these conductors in relation to the area of the array is comparatively small. In order to improve transparency if metal address conductors were to be used, the switching devices of the sense elements can be arranged so as to lie over or beneath an adjacent portion of an address conductor. In this way, the design of the sense element is effectively optimised so as to maximise transparency.

Figure 5:
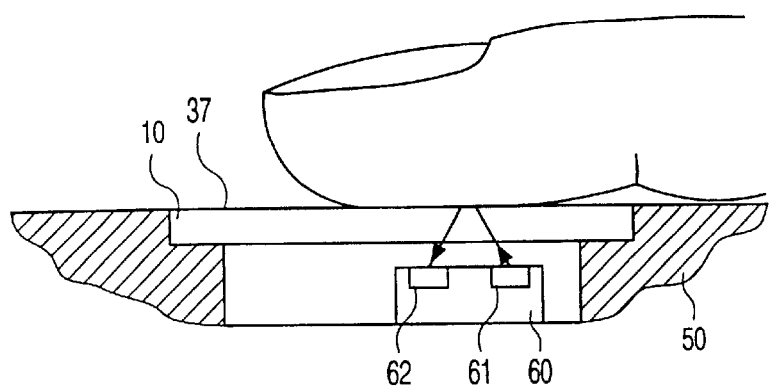
FIG. 5 is a cross-sectional view through part of an embodiment of electronic apparatus incorporating an additional biometric sensor.

The transparency of the fingerprint sensor can be used to advantage in various ways. In one particular example, an additional biometric sensor of the contactless kind which relies for its sensing on the use of light, such as visible or IR light, can conveniently be positioned behind the fingerprint sensing array. An example of such an arrangement is shown diagrammatically in FIG. 5. The fingerprint sensing element array 10 is carried in a housing 50 with its sensing surface 37 onto which a user's finger is placed facing outward. A further biometric sensor 60 is disposed within the housing beneath the sensing array so as to sense a different biometric characteristic of the person's finger remotely by means of light directed through the substantially transparent array at the same time as the fingerprint is being sensed. The biometric sensor may be, for example, a pulse oximeter. Such a sensor typically has light source, for example LEDs, emitting red and infra-red light beams which are directed onto human tissue and a detector which receives the light transmitted through or reflected from the tissue. An example of this kind of sensor is described in U.S. Pat. No. 4,759,369 to which reference is invited. The intensity of the transmitted or reflected light is affected by the colour of the blood and the detector produces a signal which is a function of the colour of the blood and the pulse of the person which is separable into a constant component indicative of the colour, and thus oxygen saturation level, of the blood and a time varying component indicative of the pulse rate. In the embodiment of FIG. 5, the sensor is arranged to operate in reflective mode with the light source 61 directing light with red and infra-red components through the sensing array 10 towards the person's finger and with the detector 62 receiving the reflected components. Other kinds of biosensors capable of detecting in non-contact manner a biometric characteristic using radiation transmitted through the fingerprint sensing array, and including wavelength ranges outside the visible spectrum, could also be used instead of, or in addition to, the sensor 60. For example, it is envisaged that the sensor 60 could be a temperature sensor adapted to sense the skin temperature of the person's finger by means of the infra-red reduction emitted from the finger, or a sensor adapted to sense optically the spectral characteristics of a finger.

Because the sensor is effectively buried beneath the fingerprint sensing array, it will be appreciated that the region of the equipment in which the combination of the fingerprint sensing array 10 and the sensor 60 is provided can be very compact with the outer surface of the fingerprint sensing array and the surrounding area of the housing being flush and generally flat. Previously this has not been possible in arrangements for sensing simultaneously both a fingerprint and another biometric characteristic such as pulse or oxygen saturation.

The incorporation of a sensor for an additional biometric characteristics greatly increases the security of recognition or authentication by providing further validation and reducing the possibility of fraudulent deception through use, for example, of a replica finger.

Optical sensors other than biometric sensors could be employed behind the fingerprint sensing element array. For example, an optical finger presence sensor could be used. This can comprise an optical sensing device having a light emitter, such as an LED, for emitting a beam of light, which can be visible or IR light, that is directed through the fingerprint sensing element array and a photodetector for detecting light reflected back through the array by a finger. Such an optical sensing device can be provided in similar manner to the device referenced 60 in FIG. 5. The device may be connected to the drive circuitry of the fingerprint sensing device such that an output from the photodetector indicative of the presence of a finger is operable to initiate scanning drive of the sensing element array. Thus, when a person's finger is placed over the array, the fingerprint sensing device is automatically operated to scan its fingerprint.

In some situations, the sensing element array could possibly exhibit a sufficient degree of transparency to enable optical sensing devices for sensing through the array a further biometric characteristic or the presence of a finger to operate successfully without necessarily having to make the sense electrodes transparent. For example, in the kind of fingerprint sensing device of U.S. Pat. No. 5,525,442, the transparent areas of the array not occupied by the opaque sense electrodes, the TFTs and the addressing lines may be adequate to allow sufficient light to pass through the array for an optical sensing device positioned behind the array to perform its intended function. It may be, for example, that only a part of a light beam generated by the device is blocked by the opaque components and that an adequate amount of light is still able to pass through the sense element array and, after reflection, to reach the optical sensing device. The size of the opaque sense electrodes could be reduced if necessary so as to increase proportionately the area of the transparent regions of the array to improve the overall transparency.

Figure 6:
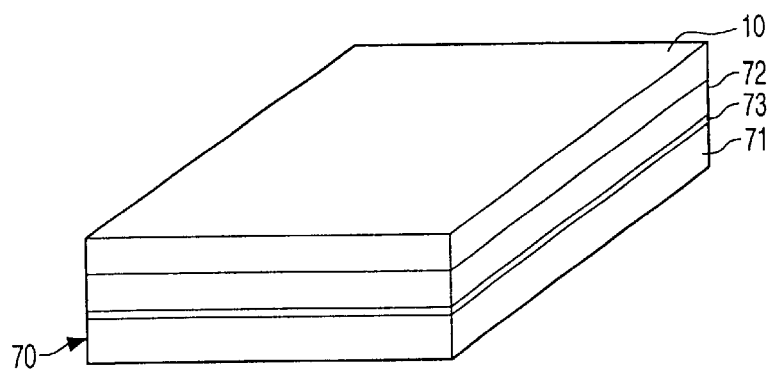
FIG. 6 illustrates a fingerprint sensing device in combination with a display device.

Another example of the beneficial use of the increased transparency of the fingerprint sensing array when using transparent sense electrodes is illustrated in FIG. 6 which shows the fingerprint sensing array 10 in combination with a flat panel display device, 70, comprising in this example a matrix liquid crystal display device. A typical matrix LC display device comprises a pair of plates 71, 72, usually of glass, spaced slightly apart and sealed together around their periphery, with LC material 73 disposed in the intervening space. The plates carry a system of electrodes and address conductors defining a row and column matrix array of individual display elements, each possibly having an associated switching device, for example a thin film transistor. LC display devices can be operable in a reflective mode, using for example ambient light, or in a transmissive mode in which case a backlight is normally provided adjacent the side of the device remote from the viewing side.

As shown in FIG. 6, the display device and fingerprint sensor 10 are of corresponding size and the fingerprint sensor is disposed directly over the upper plate, here referenced 72, of the display device on its output side with the sensing element array uppermost. For simplicity, the driving circuits for the display device and sensing array and the electrical interconnections have been omitted from FIG. 6. Conceivably, the plate 72 could be used as the substrate of the fingerprint sensor and the thin film components required for the array fabricated directly on the surface of this plate instead. Of course, the display device and fingerprint sensor need not be of similar size. With a comparatively large area display device, the fingerprint sensor would be provided over a part only of this area, either by attaching the substrate of the fingerprint sensor onto the surface of the upper plate of the display device or forming the array directly on a part of the outer surface of this plate.

Because the fingerprint sensor is substantially transparent, the display produced by the LC display device at the region underlying the sensor is readily visible therethrough. The display device may be of a simple passive dot matrix type, an active matrix type, for displaying data graphics and the like, or a dedicated type display, for example having seven bar characters or the like. Matrix display devices commonly use sets of row and column conductors between which the display elements are located and as such is similar to the structure of the fingerprint sensing array. It may be arranged, therefore, that the pitches of the row and column conductors in both the sensor array and display element array are related and that the row and column conductors in the sensor array are aligned with row and column conductors in the display element array so that the address conductors of the sensor array do not obscure the display output, particularly if those address conductors are formed of metal rather than ITO.

Although an LC display device is used in this example, other types of display devices, comprising other kinds of electro-optic materials, for example electroluminescent or electrochromic display services, could be employed instead.

Flat panel displays such as LC display devices are used extensively in a variety of portable electronic products, such as lap-top or notebook computers, PDAs, personal organisers, mobile telephones, both cellular and cordless, pagers, and the like. Fingerprint sensing in such products would be beneficial for user authentification purposes and the combination of the sensor with the display device in the aforementioned manner is of particular advantage. Free space in these products is often at a premium but by arranging the fingerprint sensor so as to overlie the display device, the sensor and display occupy the same area and the need to be able to dedicate an area of the product separate from the display to the provision of a fingerprint sensor is avoided.

Figure 7:
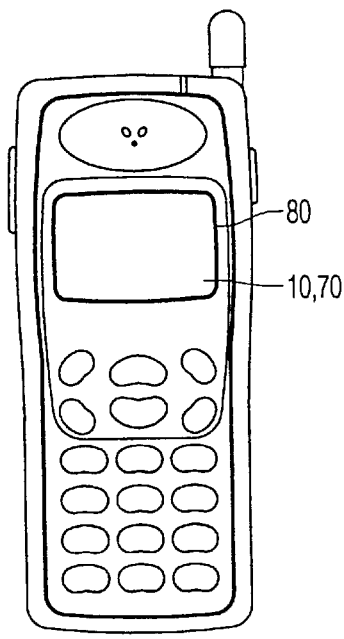
FIG. 7 shows an example mobile telephone using overlying fingerprint sensing and display devices.
Figure 8:
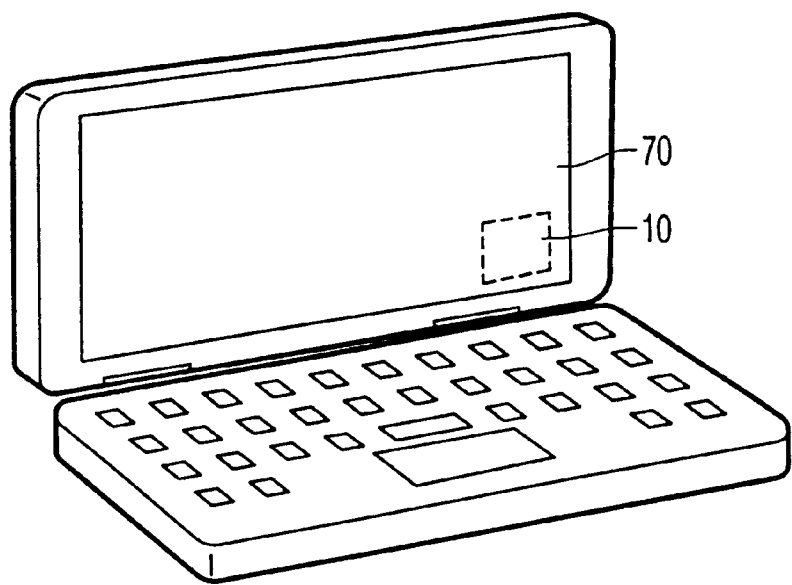
FIG. 8 shows a portable computer having a fingerprint sensing device overlying a part of its display screen.

FIGS. 7 and 8 show respectively examples of a mobile telephone and a notebook computer incorporating a fingerprint sensor. Referring to FIG. 7, the fingerprint sensor 10 is incorporated in the display window 80 of the telephone housing overlying the LC display panel 70 provided to display user information in similar manner to the arrangement of FIG. 6. Referring to FIG. 8, the fingerprint sensor overlies a relatively small part of the area of the LC display panel 70. To assist a user in correctly positioning a finger over the fingerprint sensor, the display panel can be arranged to provide a display, when needed, to indicate the location of the fingerprint sensor. In both products operating instructions for using the fingerprint sensor can be displayed on the panel.

The display device may be of a very simple kind, perhaps having a fixed display output. In this respect, it is envisaged that the fingerprint sensing device could be mounted on an illuminated push-button switch which, when illuminated, displays a fixed legend or instruction, such as "push", which is visible through the sensing device. The switch may be arranged to operate the fingerprint sensing device so that merely by obeying the displayed instruction a person's fingerprint would be automatically scanned.

Figure 9:
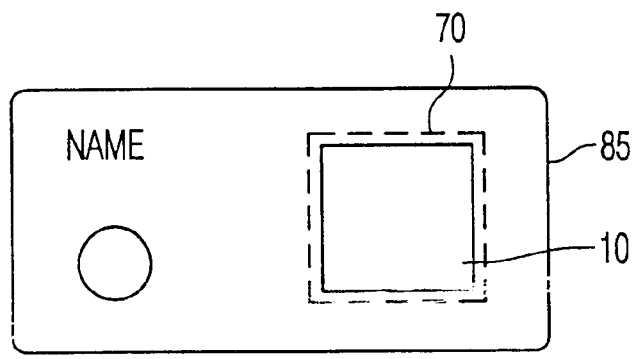
FIG. 9 is a plan view of a smart card incorporating a fingerprint sensing device.

Another example of a portable electronic product in which a fingerprint sensing device could be used to provide additional security is a smart card. It has been suggested that a small display device, for example an LCD, could be incorporated in such a product, in which case the transparent fingerprint sensing device can similarly be disposed over the display device. However, the transparent fingerprint sensing device could be used also to advantage in a smart card or like product without a display device. The transparency of the device would enable printed information present beneath the device to be seen. FIG. 9 is a plan view of an example smart card, 85, having an integrated fingerprint sensing device 10, and an optional, underlying display device 70.

From reading the present disclosure, other modifications will be apparent to persons skilled in the art. Such modifications may involve other features which are already known in the field of fingerprint sensing devices, products incorporating such and components thereof and which may be used instead of or in addition to features already described herein.

What is claimed is:

1. An electronic apparatus comprising a fingerprint sensing device having an array of spaced sensing elements carried on a transparent substrate for sensing capacitively a ridge pattern of a person's fingerprint when placed over the array, each sensing element comprising a sense electrode and an insulating layer overlying the sense electrode, for producing in combination with a fingerprint part overlying the insulating layer a capacitive effect, wherein the sensing elements of the array are substantially transparent with the sense electrodes being formed of transparent conductive material and their overlying insulating layer also being formed of transparent material, and wherein a biometric sensor device is disposed beneath the substrate for optically sensing through the substrate and the sensing element array an additional biometric characteristic of a finger overlying the array of sensing elements other than the fingerprint pattern.

2. An electronic apparatus according to claim 1, characterized in that the sensing elements are arranged in a row and column matrix and addressed via sets of row and column address conductors carried on the substrate and extending between the sensing elements.

3. An electronic apparatus according to claim 2, characterized in that the address conductors of at least one of the sets are formed of transparent conductive material.

4. An electronic apparatus according to claim 2, characterized in that each sensing element includes at least one switching device which is connected to the sense electrode and is arranged so as to overlap substantially with an address conductor.

5. An electronic apparatus according to claim 1, characterized in that the array of sensing elements is disposed over a display device whose display output is transmitted through the sensing element array.

6. An electronic apparatus according to claim 5, characterized in that display device comprises a liquid crystal display device.

7. An electronic apparatus according to claim 5, characterized in that the apparatus comprises a mobile telecommunications apparatus.

8. An electronic apparatus according to claim 5, characterized in that the apparatus comprises a portable computer.

9. An electronic apparatus according to claim 1, characterized in that the apparatus comprises a smart card.

10. An electronic apparatus according to claim 1, characterized in that the apparatus comprises an electrical switch and the sensing element array extends over an illuminatable actuating element of the switch.

11. An electronic apparatus according to claim 1, characterized in that the sensor device comprising a pulse oximeter sensor using infra red and visible light transmitted through the sensing element array.

12. An electronic apparatus according to claim 1, characterized in that the optical sensing device is connected to a drive circuit of the fingerprint sensing device and arranged to operate the fingerprint sensing device upon the presence of a finger being sensed thereby.

13. An electronic apparatus according to claim 1, characterized in that the sensor device comprises a pulse oximeter sensor using infra red and visible light transmitted through the sensing element array.

14. An electronic apparatus according to claim 1, characterized in that the biometric optical sensing device is connected to a drive circuit of the fingerprint sensing device and arranged to operate the fingerprint sensing device upon the presence of a finger being sensed thereby.

* * * * *